United States Patent
Howells

(10) Patent No.: US 6,768,836 B2
(45) Date of Patent: Jul. 27, 2004

(54) PHOSPHOR COATED WAVEGUIDE FOR THE EFFICIENT COLLECTION OF ELECTRON-GENERATED PHOTONS

(75) Inventor: Samuel C. Howells, Portland, OR (US)

(73) Assignee: Applied Materials, Inc., Santa Clara, CA (US)

( * ) Notice: Subject to any disclaimer, the term of this patent is extended or adjusted under 35 U.S.C. 154(b) by 441 days.

(21) Appl. No.: 10/033,307

(22) Filed: Nov. 2, 2001

(65) Prior Publication Data
US 2003/0085361 A1 May 8, 2003

(51) Int. Cl.⁷ ................................................ G02B 6/26
(52) U.S. Cl. .................... 385/31; 385/121; 250/397; 250/311
(58) Field of Search .................. 385/12, 121, 31, 385/115, 116, 127, 128; 250/310, 311, 397

(56) References Cited

U.S. PATENT DOCUMENTS

| | | | |
|---|---|---|---|
| 4,177,379 A | * 12/1979 | Furukawa et al. | 250/397 |
| 4,217,495 A | 8/1980 | Robinson | 250/310 |
| 4,485,302 A | * 11/1984 | Tanaka et al. | 385/121 |
| 4,700,075 A | 10/1987 | Kurz | 250/368 |
| 5,043,583 A | 8/1991 | Robinson | 250/397 |
| 5,198,675 A | 3/1993 | Hikita et al. | 250/397 |
| 5,990,483 A | 11/1999 | Shariv et al. | 250/397 |
| 6,031,230 A | * 2/2000 | Toumatsu | 250/397 |
| 6,211,525 B1 | * 4/2001 | Cowham | 250/397 |

FOREIGN PATENT DOCUMENTS

WO WO 98/40906 * 9/1998 .......... H01J/37/244

* cited by examiner

Primary Examiner—Michael P. Stafira
Assistant Examiner—Juan D Valentin, II
(74) Attorney, Agent, or Firm—Sughrue Mion LLP

(57) ABSTRACT

A waveguide made of optical glass used as an detector in electron microscopy, having a beveled hole through which an electron beam passes and a phosphor coated region to detect secondary and back-scattered electrons. The photons generated by secondary and back-scattered electrons striking the phosphor coated region are directed to a photomultiplier detector mated to the waveguide by internal reflections which are further enhanced by reflective surfaces. Further, photon transmission from the waveguide to the photomultiplier is enhanced by providing a flared section at the mating end to reduce internal reflections.

13 Claims, 5 Drawing Sheets

//PHOSPHOR COATED WAVEGUIDE FOR THE EFFICIENT COLLECTION OF ELECTRON-GENERATED PHOTONS

BACKGROUND OF THE INVENTION

1. Field of the Invention

The present invention relates to a waveguide for the efficient detection and collection of back-scattered electrons in electron beam apparatuses such as electron microscopes.

2. Description of the Related Art

Back-scattered electrons are detected using scintillators. Typically electrons are directed to strike a phosphor coating on a piece of glass or plastic so that the light generated by the phosphor is directed onto a detector placed at one end of a light guide. A typical light guide is shown in FIG. 1. The drawback with this type of detector is that it has a low collection efficiency, thus limiting the speed at which the system can be operated. Also, the collection efficiency is not very homogeneous throughout the phosphor coating, i.e. the collection efficiency is a strong function of where the electron strikes the phosphor. Electrons that strike the phosphor on the same side of the hole as the detector are much more efficiently collected than those that strike the opposite side of the hole from the detector. The collection inhomogeneity leads to a reduced contrast depending on how the electrons scatter from the sample.

SUMMARY OF THE INVENTION

A primary object of this invention is to provide a more efficient waveguide for detecting back-scattered and secondary electrons, particularly back-scattered or secondary electrons reflected from or emitted by a sample scanned by an electron beam from a minicolumn or microcolumn used in an electron microscope. A waveguide of optical glass is designed so that, when back-scattered or secondary electrons are detected by a phosphor deposited on the waveguide, the light emitted by the phosphor is reflected internally along the waveguide to a detector. The inventive design includes surfaces in the region of the phosphor deposition which are coated with a highly reflective material to direct the light towards the end of the waveguide to which the detector is coupled. Further, the waveguide may include a flared section at the detector end to ensure that all rays striking the output face of the waveguide strike the surface at angles less than the critical angle and are transmitted to the detector.

BRIEF DESCRIPTION OF THE DRAWINGS

These and other features and benefits of the invention will be readily appreciated in the light of the following detailed description of preferred embodiments thereof, given by way of example only with reference to the accompanying drawings wherein.

DETAILED DESCRIPTION OF THE PREFERRED EMBODIMENTS

Preferred embodiments of the present invention will now be described with reference to the attached drawings, wherein identical elements are designated with like numerals.

Figure 3:
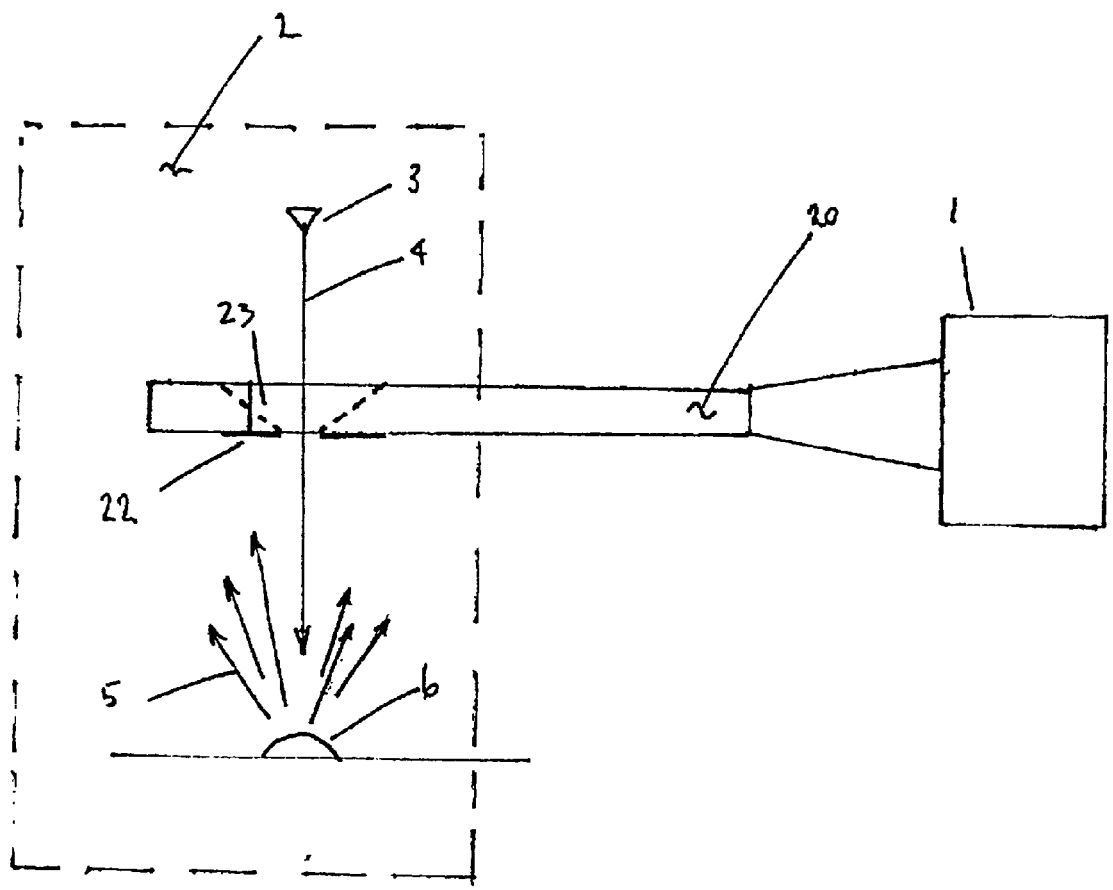
FIG. 3 shows a typical installation of the inventive waveguide.

The inventive waveguide offers clear and distinct advantages over other waveguides used to detect secondary or back-scattered electrons. In a typical installation, referring to FIG. 3, a waveguide 20 used to detect back-scattered and secondary electrons 5 is positioned within an electron microscope 2 containing an electron beam source 3. The electron beam 4 passes through a beveled hole 23 and strikes a sample under inspection 6. The electron beam 4 generates back-scattered and secondary electrons 5 which in turn strike the phosphor coating 22. The phosphor coating 22 acts as a Lambertian source directing most of the emitted light into the waveguide 20 perpendicular to the top 28 and bottom 27 faces, where the light is reflected off the interior surfaces and directed towards a detector 1, which may be a photomultiplier tube detector.

Figure 1A:
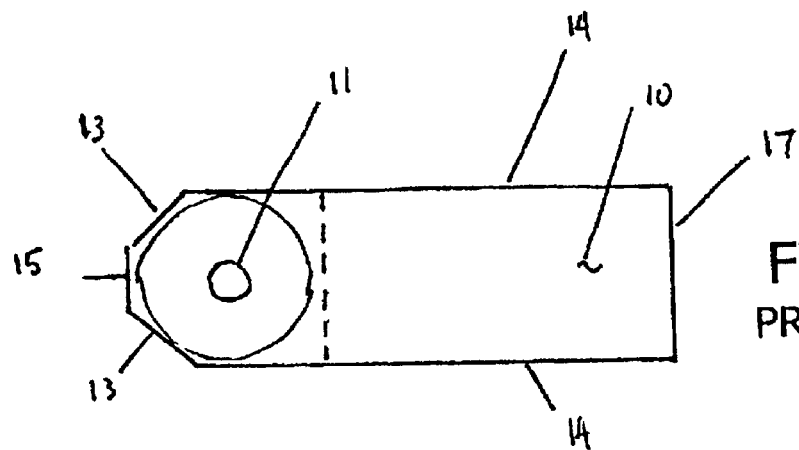
FIG. 1 shows a conventional design.
Figure 1B:
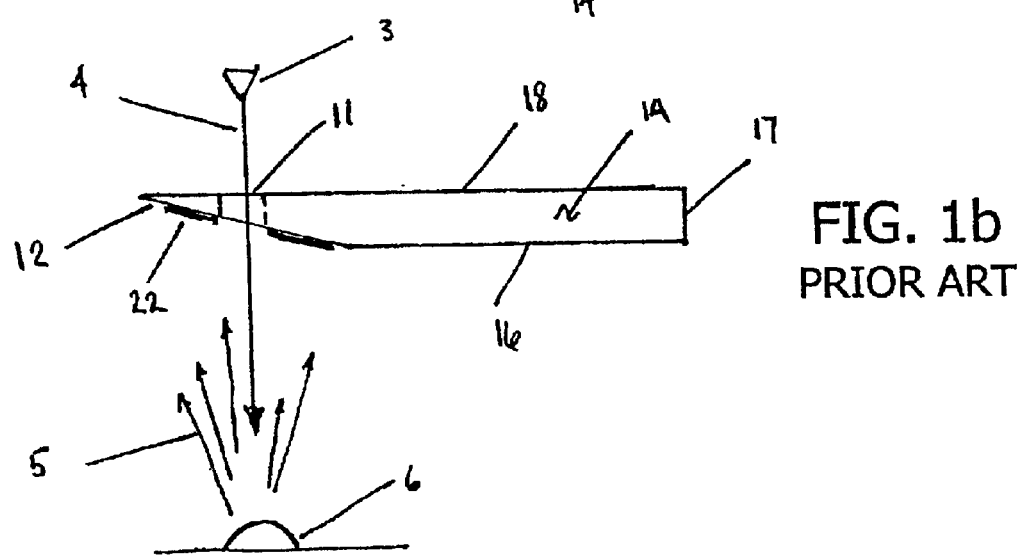

In a conventional design, as shown in FIGS. 1a and 1b, back-scattered and secondary electrons 5 strike a phosphor coating 22 which is deposited on an angled face 12 annularly about a hole 11 through which the electron beam 4 passes. Photons from the phosphor coating 22 are emitted into the waveguide 10 and are reflected by the internal surfaces of the waveguide 10. Photons which strike the interior surface of the waveguide 10 at an angle of incidence (AOI) greater than the critical angle (critical angle=ArcSin(1/n), where n is the refractive index of the waveguide material) are internally reflected, while those that strike the inner surface at less than the critical angle are lost from the waveguide 10. The angled sides 13 tend to reflect photons towards the rear face 17 either directly or off the side faces 14 or the top 18 and bottom faces 16. A detector is then optically coupled to the rear face 17 to collect the reflected photons.

Figure 2A:
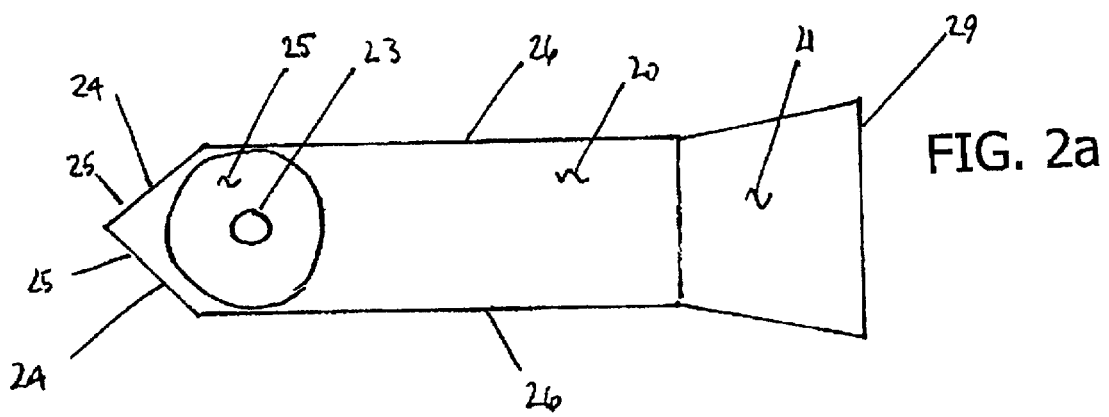
FIG. 2 shows a first embodiment of the inventive waveguide.
Figure 2B:
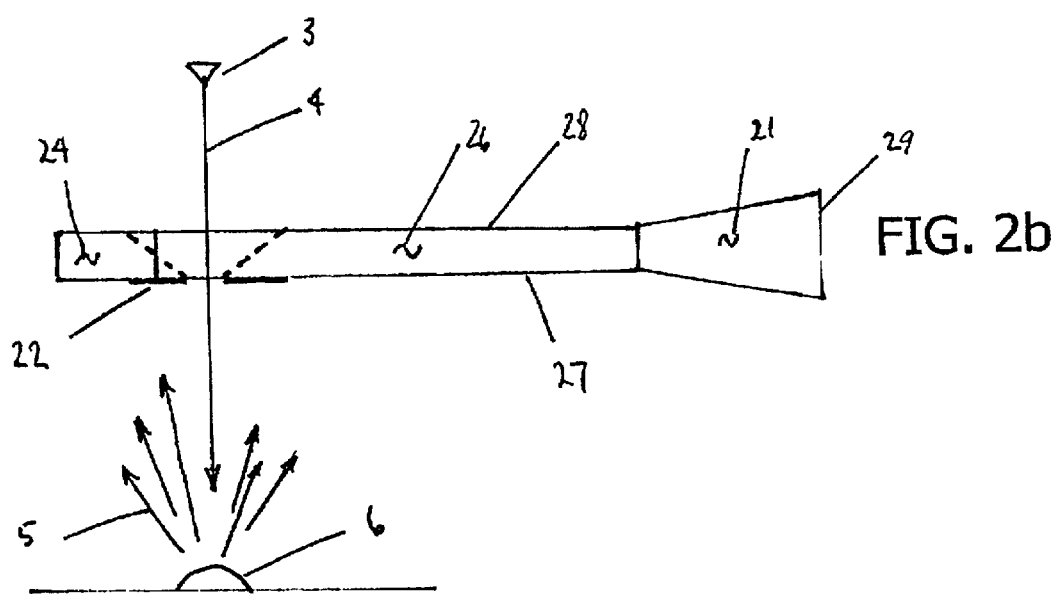

The inventive waveguide, FIGS. 2a and 2b, provided improved efficiency of the transmission of photons from one end of the waveguide 20 to the other end. As back-scattered and secondary electrons 5 strike the phosphor coating 22, photons are emitted into the waveguide 20. The photons that strike the interior surface of the beveled hole 23 are reflected radially outward at shallow angles nearly parallel to the top 28 and bottom 27 faces. To further enhance photon reflection, a reflective coating 25 is deposited on the inside surface of the beveled hole 23. The material of the reflective coating 25 is selected according to the wavelength of the light produced by the phosphor coating 22, and is typically aluminum or silver, though other suitable reflective coatings also may be used. Those photons which are reflected along the longitudinal axis will arrive at the rear face 29 either directly or after one or more reflections off the side faces 26, the top face 28 or the bottom face 27. Those photons reflected towards the front of the waveguide 20 are further reflected off the angled sides 24 and directed towards the rear face 29. The angled sides 24 also have a reflective coating 25.

Further to minimize reflected loss at the rear face 29, the waveguide 20 preferably has a flared section 21. If the waveguide 20 were manufactured without the flared section 21, a fraction of the light striking the rear face of the straight section would hit the surface at angles greater than the critical angle and would not reach a coupled detector. Including the flared section 21 ensures that all rays that strike the rear face 29 of the waveguide 20 are transmitted through the rear face 29 and reach the detector. The flared section 21 increases the collection efficiency of the waveguide 20 by approximately 30%. The flared section 21 can be manufactured integrally with the waveguide 20, or can be manufactured separately and joined to the straight section in a manner that provides minimal optical losses at the interface.

The beveled hole 23 preferably has a bevel angle of approximately 45° and the angled sides 24 meet at an angle of approximately 90°, though other angles also may be used. Also, the taper of each of the four sides of the flared section 21 preferably is about 10°. The dimensions of the inventive waveguide are such that the waveguide 20 is usable in an electron microscope with a microcolumn as an electron source 3 having a cross-sectional area of about one inch square. The dimensions of the waveguide are approximately 22 mm in length of which approximately 16 mm is a straight section and 6 mm is the flared section. The flared section is 6 mm wide and 1.5 mm thick at one end, and 8.1 mm wide and 3.6 mm thick at the other. Of course, the dimensions of the waveguide 20 are variable to meet the needs of particular situations. All surfaces of the waveguide 20 are polished to specularly reflect light impinging on the surface.

Figure 4A:
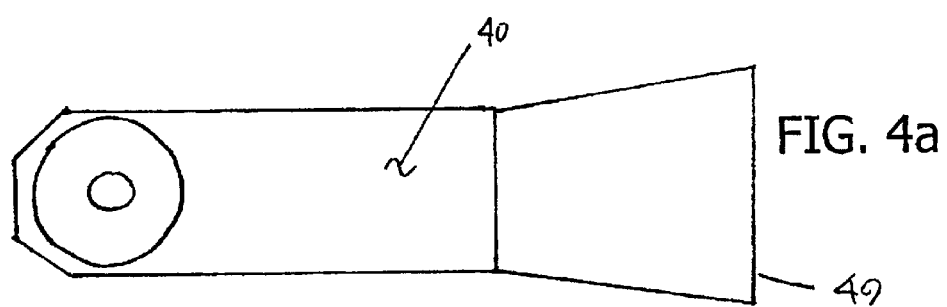
FIG. 4 shows a second embodiment of the inventive waveguide.
Figure 4B:
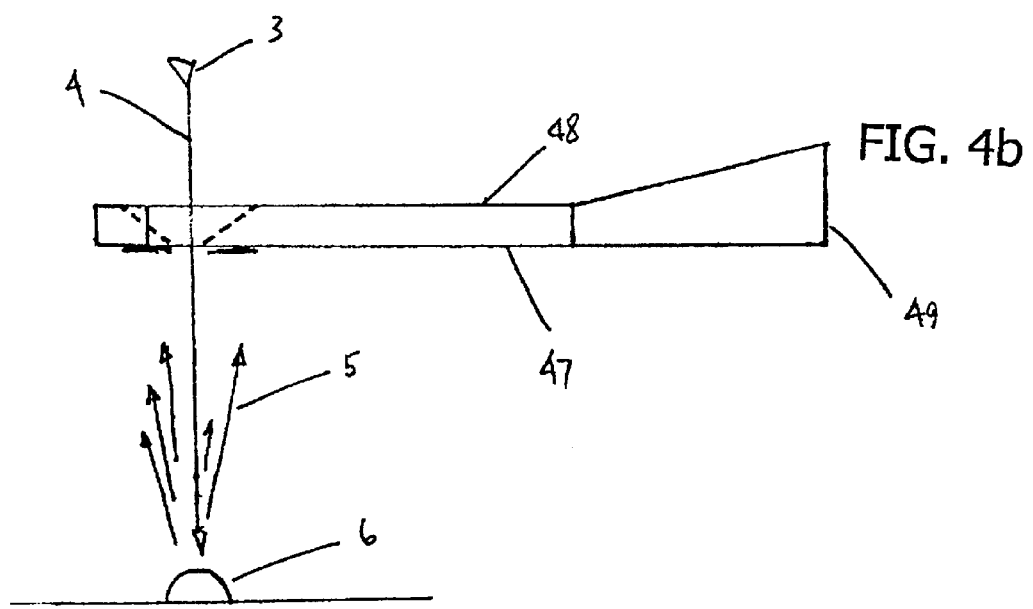

In a further embodiment as shown in FIGS. 4a and 4b, the dimensions of the flared section 41 have been changed to allow the waveguide 40 to be placed closer to the sample 6. In this embodiment, the bottom face 47 has not been flared, and to compensate, the length of the flared section has been increased to 8 mm, and the flare angle of the top face 48 has been increased to approximately 15° with corresponding increases in the dimensions of the rear face 49.

Figure 5:
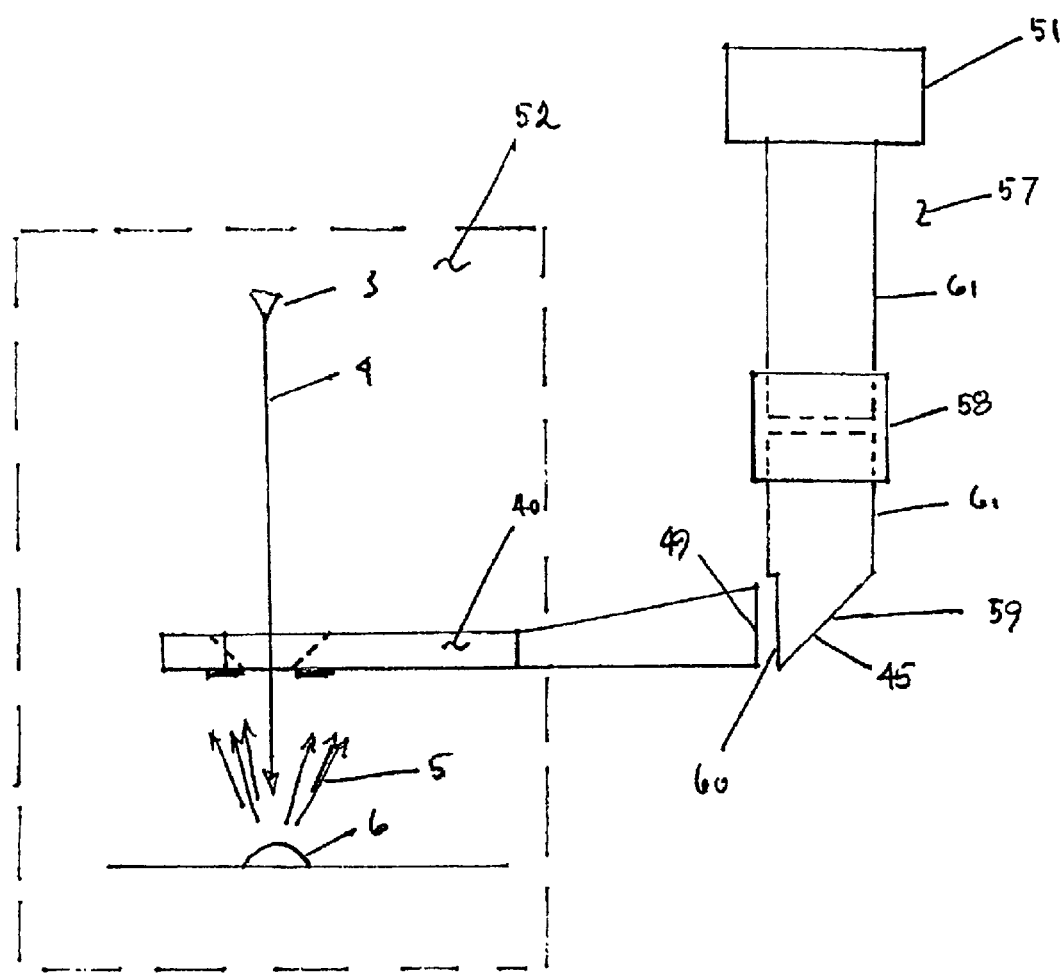
FIG. 5 shows a further embodiment of the inventive waveguide.

In a still further embodiment as shown in FIG. 5, the waveguide 40 as shown in FIGS. 4a and 4b is coupled with a first end of a cylindrical light guide 57 for the purpose of placing the detector 51 in a more mechanically advantageous location. The cylindrical light guide 57 is composed of two optical cylinders 61 of a refractive index close to that of the flared waveguide 40 and of identical diameters to each other. The cylinders 61 are aligned coaxially and a tight fitting sleeve 58 with a reflective coating disposed on its interior surface surrounds the gap between the cylinders 61. The lower cylinder is engineered to have a face 59 at an angle of 45° to the axis of the cylinder 61, and further having a notch 60 with a flat surface that is able to mate with the rear face 49 of the flared waveguide 40. The angled face 59 is further coated with a reflective coating 45. A detector 51 is coupled to the second end of the cylindrical light guide 57.

Having thus described our invention, what we claim as new, and desire to secure by Letters Patent is:

1. For use in an electron microscope, a waveguide comprising:
    a) a first end adapted for coupling to a detector;
    b) a second end having angled sides, said second end having a beveled hole for passing an electron beam of said electron microscope therethrough, said angled sides having a first reflective coating, said beveled hole having an inner surface with a second reflective coating disposed thereon; and
    c) a phosphor coating disposed on said second end around a narrower opening to an approximate diameter of a wide opening of said beveled hole.

2. A waveguide as claimed in claim 1 wherein said waveguide comprises optical material having a refractive index of approximately 1.5.

3. A waveguide as claimed in claim 1 wherein said first end is flared.

4. A waveguide as claimed in claim 3 wherein said first end is manufactured as a first piece and said second end is manufactured as a second piece, and said first and said second pieces are joined at an interface having minimal reflective losses.

5. A waveguide as claimed in claim 1 wherein said angled sides form an angle of substantially 90°.

6. A waveguide as claimed in claim 1 wherein said beveled hole has bevel angle of substantially 45°.

7. A waveguide as claimed in claim 1 wherein said first and said second reflective coatings are selected from the group consisting of aluminum and silver.

8. A waveguide as claimed in claim 1 wherein said waveguide has approximate dimensions of 22 to 24 mm in length, 6 mm in width, and 1.5 to 3.6 mm in thickness.

9. A waveguide a claimed in claim 1 wherein said first end of said waveguide is dimensioned to fit within a microcolumn of said electron microscope.

10. A waveguide as claimed in claim 1 further comprising a cylindrical light guide, said light guide being disposed between said waveguide and a photomultiplier, said light guide having
    a) an angled face, said angled face having an angle of 45° to the longitudinal axis of said light guide, said angled face further having a third reflective coating,
    b) a notch for mating with said first end of said waveguide, and
    c) a plurality of sleeves having a inner surface for optically coupling said optical cylinders, said inner surface having a fourth reflective coating deposed thereon.

11. A waveguide as claimed in claim 10 wherein said third and said fourth reflective coatings are selected from the group consisting of aluminum and silver.

12. A waveguide as claimed in claim 10 wherein said cylindrical light guide is comprised of a plurality of optical cylinders.

13. A waveguide as claimed in claim 1 wherein said detector is a photomultiplier.

* * * * *